United States Patent [19]
Hara et al.

[11] Patent Number: 5,923,119
[45] Date of Patent: Jul. 13, 1999

[54] ORGANIC THIN-FILM ELECTROLUMINESCENT DISPLAY DEVICE, METHOD FOR DRIVING THE SAME AND METHOD FOR FABRICATING THE SAME

[75] Inventors: Shintaro Hara, Fukuoka; Hideaki Iwanaga, Fukuoka-ken; Akira Gyoutoku, Saga-ken; Takahiro Komatsu, Kasuga; Chiharu Wakamatsu, Kagoshima, all of Japan

[73] Assignee: Matsushita Electric Industrial Co., Ltd., Osaka, Japan

[21] Appl. No.: 08/856,807

[22] Filed: May 15, 1997

[30] Foreign Application Priority Data

May 20, 1996 [JP] Japan .................................. 8-124206
May 21, 1996 [JP] Japan .................................. 8-125414

[51] Int. Cl.⁶ .................................................. H05B 33/14
[52] U.S. Cl. ........................ 313/506; 313/503; 313/505; 428/690
[58] Field of Search .................... 313/503, 505, 313/506, 512; 428/690

[56] References Cited

U.S. PATENT DOCUMENTS

| | | | |
|---|---|---|---|
| 5,073,446 | 12/1991 | Scozzafava et al. | 313/503 X |
| 5,231,329 | 7/1993 | Nishikitani et al. | 313/506 X |
| 5,487,953 | 1/1996 | Shihora et al. | 428/690 |

OTHER PUBLICATIONS

Tang, et al.. "Organic electroluminescent diodes," Appl. Phys. Lett., vol. 12, Sep. 21, 1987, pp. 913–915.

*Primary Examiner*—Ashok Patel
*Attorney, Agent, or Firm*—Stevens, Davis, Miller & Mosher, L.L.P.

[57] ABSTRACT

An organic thin-film electroluminescent display device comprising a substrate, hole injection electrodes, an organic thin film layer, electron injection electrodes, an electrode-driving IC for driving the electron injection electrodes and the electron injection electrodes and lead wires for connecting the hole injection electrodes and the electron injection electrodes to the electrode-driving IC. The lead wires each include a lead underlayer made of the same material of the hole injection electrode and a lead electroconductive layer formed on the lead underlayer and having a higher electroconductivity than that of the lead underlayer and or the electron injection electrodes each may include an underlayer for the electron injection electrode and an electroconductive layer for the electron injection electrode formed on the underlayer for the electron injection electrode and having a higher electroconductivity than that of the underlayer for the electron. The device injection electrode can prevent fluctuations in luminescence brightness due to different ohmic losses of lead wires connecting the hole injection electrodes and the electron injection electrodes to the electrode-driving IC and due to different electric resistances of electron injection electrodes.

6 Claims, 4 Drawing Sheets

ORGANIC THIN-FILM ELECTROLUMINESCENT DISPLAY DEVICE, METHOD FOR DRIVING THE SAME AND METHOD FOR FABRICATING THE SAME

BACKGROUND OF THE INVENTION

The present invention relates to an organic thin-film electroluminescent display device for use in display panels such as segment matrix panels, dot matrix panels, etc., a method for driving the same and a method for fabricating the same.

The electroluminescent display device is a light-emitting device based on utilization of electroluminescence of solid fluorescent materials. Inorganic electroluminescent display devices using inorganic materials are presently being applied with regard to backlighting, planar display, etc. of liquid crystal displays. However, the inorganic electroluminescent display device has such disadvantages as necessity for driving with a high ac voltage such as 100 V or more and difficulty in blue light emission and consequent difficulty in full colorization based on three primary colors. In 1987, on the other hand, Eastman Kodak Company proposed an organic thin-film electroluminescent device having an organic thin-film double layer structure of functional separation type, where the thin film of organic materials is functionally divided into two layers, i.e. a hole transport layer and a light-emitting layer, and it was found that an organic thin-film electroluminescent display device based on the proposed electroluminescent device had a high luminescence brightness such as 1000 cd/m$^2$ or more at a low driving voltage of 10 V or less (see Applied Physics Letters, 51 912 et seq). Since then, research and development of organic thin-film electroluminescent display devices of similar laminated structure using organic materials have been extensively made with a keen desire for development of an organic thin-film electroluminescent display device having a larger display area, a higher resolution and a more uniform luminescence brightness.

One conventional example of an organic thin-film electroluminescent display device having such a laminated structure will be described below, referring to FIGS. 5 and 6.

FIG. 5 is a schematic cross-sectional view of a conventional organic thin-film electroluminescent display device and FIG. 6 is a schematic plan view of the conventional organic thin-film electroluminescent display device, where numeral 101 is a transparent substrate of glass, etc.; 102 hole injection electrodes of ITO (indium tin oxide: tin-containing indium oxide), etc. formed on substrate 101; 111 a hole transport layer consisting of a film of N,N'-diphenyl-N,N'-bis(3-methylphenyl)-1,1'-diphenyl-4,4'-diamine (which will be hereinafter referred to as TPD), etc., formed on hole injection electrode 102; 112 is a light-emitting layer consisting of a film of 8-hydroxyquinoline aluminum (which will be hereinafter referred to as Alqz), etc., laid on hole transport layer 111; 106 electron injection electrodes consisting of Al-Li alloy, Mg-Ag alloy, etc., laid on light-emitting layer 112; 107 an electrode-driving IC mounted on substrate 101 for driving hole injection electrodes 102 and electron injection electrodes 106; 110 lead wires formed on substrate 101 for connecting hole injection electrodes 102 and electron injection electrodes 106 to electrode-driving IC 107, respectively; 113 light-emitting regions within light-emitting layer 112. In FIG. 5, organic thin film layer 103 is in a double layer structure consisting of hole transport layer 111 and light-emitting layer 112. Preferable materials for hole injection electrodes 102 are materials having a good electroconductivity and a high transparency capable of good transmission of light emitted from light-emitting layer 112. As materials for electron injection electrodes 10, materials having a low work function and a high electroconductivity have been proposed so as to enable easy electron injection into light-emitting layer 112. To give a matrix form luminescence to desired regions of the organic thin-film electroluminescent display device, hole injection electrodes 102 and electron injection electrodes 106 are divided in a plurality of segments patterned by etraight lines crossing at right angles to one another, etc., and a plurality of lead wires 110 are provided for connection to the respective hole injection electrodes 102 and electron injection electrodes 106. When hole injection electrodes 102 and electron injection electrodes 106 of the organic thin-film electroluminescent display device in the foregoing structure are driven by application of a dc voltage thereto from electrode-driving IC 107, light-emitting regions 113 within light-emitting layer 112, i.e. regions corresponding to segments enclosed by hole injection electrodes 102 and electron injection electrodes 106, will emit light. Application of a dc voltage to hole injection electrodes 102 and electron injection electrodes 106 is based on such a system with scanning electrodes called common electrodes on the one hand and data electrodes called segment electrodes on the other hand, in which a voltage is applied to crossing points of these electrodes to emit light there. A predetermined voltage is periodically and sequentially applied to a plurality of common electrode-constituting electrodes, while a voltage corresponding to a signal for image display is applied to a plurality of segment electrode-constituting electrodes.

However, in the conventional organic thin-film electroluminescent display device, hole injection electrodes 102 and lead wires 110 are made of the same materials. For example, in case of using an ITO film for the hole injection electrodes, ohmic loss is largely different from one lead wire to another, depending on distances of lead wires 110 from electrode-driving IC 107 to the respective hole injection electrodes 102 and the respective electron injection electrodes 106, because the ITO film has a resistivity as high as 10$^{16}$ Ωcm. Thus, different quantities of current are input to the individual hole injection electrodes and the individual electron electrodes 106 due to the different ohmic losses, and consequently the conventional organic thin-film electroluminescent display device has such a problem as fluctuations in luminescence brightness in the light-emitting regions.

Furthermore, in case of driving either hole injection electrodes 102 of ITO film, etc. or electron injection electrodes 106 of Al-Li alloy, Mg-Ag alloy, etc. as common electrodes of the conventional organic thin-film electroluminescent display device, the common electrodes are so high in electric resistance that ohmic loss largely differs from one common electrode to another, and thus different quantities of current are input to the individual common electrodes, depending on the difference in ohmic loss. Thus, the conventional organic thin-film electroluminescent device has such a problem as fluctuation in luminescence brightness in the light-emitting regions. It is possible to lower the electric resistance by increasing the thickness of hole injection electrodes 102, but the luminescence brightness will be lowered due to increased thickness of hole injection electrodes 102. On the other hand, an increase in the thickness of electron injection electrodes 106 is not satisfactory for lowering the electric resistance.

SUMMARY OF THE INVENTION

The present invention is to solve the above-mentioned problems so far encountered.

An object of the present invention is to provide an organic thin-film electroluminescent display device capable of reducing fluctuations in luminescence brightness due to different ohmic losses of lead cores by decreasing the electric resistance of lead cores connecting hole injection electrodes and electron injection electrodes to an electrode-driving IC and also capable of reducing fluctuations in luminescence brightness due to different quantities of current to be input to one electron injection electrode to another by decreasing the electric resistance of electron injection electrodes.

Another object of the present invention is to provide a method for driving an organic thin-film electroluminescent display device capable of reducing fluctuations in luminescence brightness.

A further object of the present invention is to provide a method for fabricating an organic thin-film electroluminescent display device capable of decreasing electric resistance of lead wires connecting hole injection electrodes and electron injection electrodes to an electrode-driving IC in a simple manner.

According to the present invention, there is provided an organic thin-film electroluminescent display device, which comprises a substrate, on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead wires provided on the substrate for connecting the hole injection electrodes and the electron injection electrodes to the electrode-driving IC, the lead wires each comprising a lead underlayer made of the same material as that of the hole injection electrode and an electroconductive lead layer formed on the lead underlayer and having a higher electroconductivity than that of the lead underlayer, or the electron injection electrodes each comprising an underlayer for the electron injection electrode and an electroconductive layer for the electron injection electrode formed on the underlayer for the electron injection electrode and having a higher electroconductivity than that of the underlayer for the electron injection electrode, or the lead wires each comprising a lead underlayer consisting of the same material as that of the hole injection electrode and an electroconductive lead layer formed on the lead underlayer and having a higher electroconductivity than that of the lead underlayer, and the electron injection electrodes each comprising an underlayer for the electron injection electrode and an electroconductive layer for the electron injection electrode formed on the underlayer for the electron injection electrode and having a higher electroconductivity than that of the underlayer for the electron injection electrode at the same time.

According to the present invention, there is provided a method for driving an organic thin-film electroluminescent display device comprising a substrate, on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead wires provided on the substrate for connecting the hole injection electrodes and the electron injection electrodes to the electrode-driving IC, the electron injection electrodes each comprising an underlayer for the electrode injection electrode and an electroconductive layer for the electron injection electrode formed on the underlayer for the electron injection electrode and having a higher electroconductivity than that of the underlayer for the electron injection electrode, the method comprising driving the electron injection electrodes as common electrodes and driving the hole injection electrodes as segment electrodes. In that case, the lead wires each may comprise a lead underlayer made of the same material as that of the hole injection electrode and an electroconductive lead layer formed on the lead underlayer and having a higher electroconductivity than that of the lead underlayer.

According to the present invention, there is further provided a method for fabricating an organic thin-film electroluminescent display drive comprising a substrate, on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead wires provided on the substrate for connecting the hole injection electrodes and the electron injection electrodes to the electrode-driving IC, the method comprising a first electrode-forming step of forming hole injection electrodes and lead underlayers for lead wires from the same material on a substrate, an organic thin film layer-forming step of forming an organic thin film layer on the substrate on which the hole injection electrodes and the lead under layers are formed by the first electrode-forming step, a second electrode-forming step of forming electron injection electrodes on the organic thin film layer formed by the organic thin film layer-forming step, a lead electroconductive layer-forming step of forming lead electroconductive layers having a higher electroconductivity than that of the lead under-layers each on the corresponding lead under layers on the substrate on which the electron injection electrodes are formed by the second electrode-forming step, and an IC-mounting step of mounting an electrode-driving IC on the substrate on which the lead electroconductive layers are formed by the lead electroconductive layer-forming step. The electron injection electrodes each may be in a double layer structure of an underlayer for the electron injection electrode and an electroconductive layer for the electron injection electrode.

Based on the above-mentioned structure, the present invention can provide an organic thin-film electroluminescent display device capable of reducing the electric resistance of lead wires connecting the hole injection electrodes and the electron injection electrodes to the electrode-driving IC, thereby preventing fluctuations in luminescence brightness due to different ohmic losses of lead wires, and reducing the electric resistance of the electron injection electrodes, thereby preventing fluctuations in luminescence brightness due to different quantities of currents from one electrode injection electrode to another. The present invention can also provide a method for driving the organic thin-film electroluminescent display device, which enables prevention of fluctuation in luminescence brightness. Furthermore, the present invention can provide a method for fabricating the organic thin-film electroluminescent display device, which enables reduction in electric resistance of lead wires connecting the hole injection electrodes and the electron injection electrodes to the electrode-driving IC in a simple manner, thereby preventing fluctuations in luminescence brightness.

DESCRIPTION OF THE PREFERRED EMBODIMENT INVENTION

Figure 1:
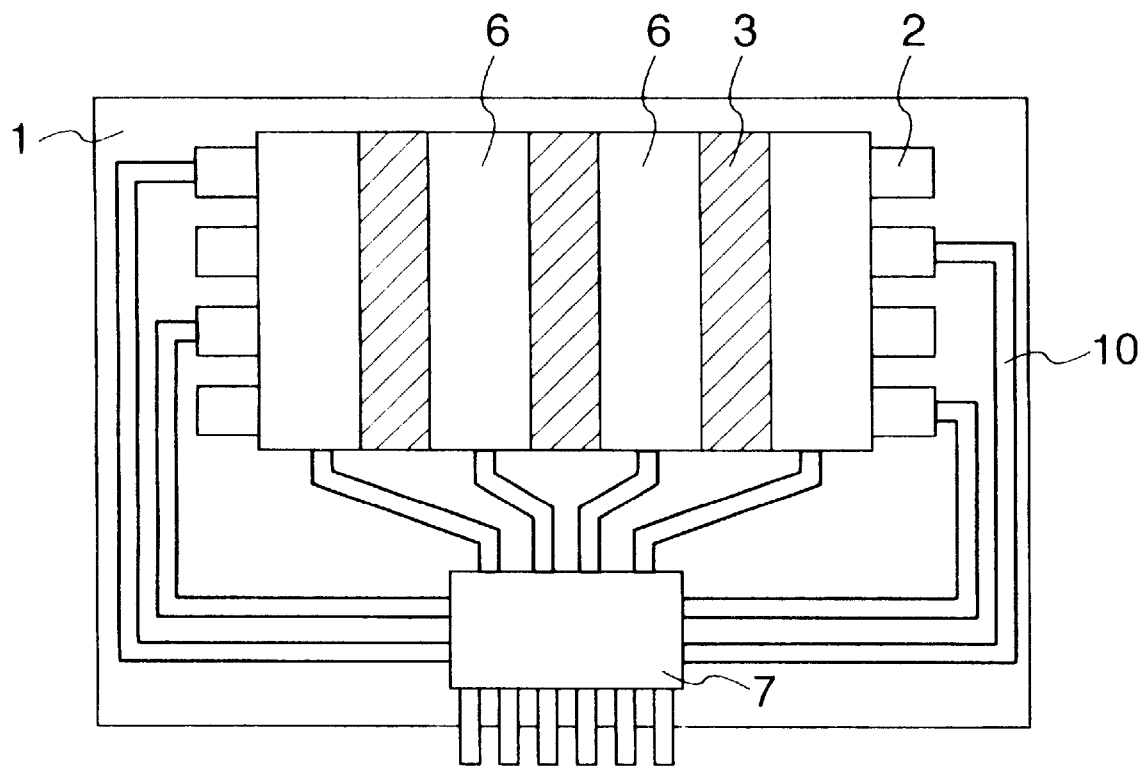
FIG. 1 is a schematic plan view of an organic thin-film electroluminescent display device according to Embodiments 1, 2 and 3 of the present invention.

The present invention provides an organic thin-film electroluminescent display device, which comprises a substrate on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead wires provided on the substrate for connecting the hole injection electrodes and the electron injection electrodes to the electrode-driving IC, the lead wires each comprising a lead underlayer made of the same material as that of the hole injection electrode and a head electroconductive layer formed on the lead underlayer and having a higher electroconductivity than that of the lead underlayer. The present display device has a function to reduce the electric resistance of lead wires connecting the hole injection electrodes and the electron injection electrodes to the electrode-driving IC, thereby preventing fluctuations in luminescence brightness due to different ohmic losses of the lead wires.

In the present invention, the lead electroconductive layer is made of at least one of copper, silver, gold, aluminum, iron nickel, molybdenum and platinum or an alloy of at least two thereof, or an alloy containing at least one of these metals and has a function to make the electrical resistance of the lead wires very low.

The present invention further provides an organic thin-film electroluminescent display device, which comprises a substrate on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead wires provided on the substrate for connecting the hole injection electrodes and the electron injection electrodes to the electrode-driving IC, the electron injection electrodes each comprising an underlayer for the electron injection electrode and an electroconductive layer for the electron injection electrode formed on the underlayer for the electron injection electrode and having a higher electroconductivity than that of the underlayer for the electron injection electrode. The present display device has a function to reduce the electric resistance of the electron injection electrodes, thereby preventing functuations in luminescence brightness due to different quantities of current from one electron injection electrode to another.

In the present invention, the electroconductive layer for the electron injection electrode is made of at least one of copper, silver, gold, platinum and aluminum or an alloy of at least two thereof. The present display device has a function to make the electric resistance of the electron injection electrodes very low.

The present invention still further provides a method for driving an organic thin-film electroluminescent display device comprising a substrate, on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead cores provided on the substrate for connecting the hole injection electrodes and the electron injection electrodes to the electrode-driving IC, the electron injection electrodes each comprising a under layer for the electron injection electrode and an electroconductive layer for the electron injection electrode formed on the under layer for the electron injection electrode and having a higher electroconductivity than that of the underlayer for the the electron injection electrode, the method comprising driving the electron injection electrodes as common electrodes and the hole injection electrodes as segment electrodes. The present method has a function to drive the electron injection electrodes having a low electric resistance as common electrodes, thereby driving the organic thin-film electrolumisesent display device while preventing fluctuations in luminescence brightness. In that case, the lead wires each may comprise a lead underlayer made of the same material as that of the hole injection electrode and an electroconductived lead layer formed on the lead underlayer and having a higher electroconductivity than that of the lead underlayer.

The present invention still further provides a method for fabricating an organic thin-film electroluminescent display device comprising a substrate, on which hole injection electrodes are formed, an organic thin film layer formed on the substrate, electron injection electrodes formed on the organic thin film layer, an electrode-driving IC mounted on the substrate for driving the hole injection electrodes and the electron injection electrodes, and lead wires provided on the substrate for connecting the hole injection electrodes and the electron injection electrodes to the electrode-driving IC, the method comprising a first, electrode-forming step of forming hole injection electrodes and lead underlayers for lead wires from the same material on a substrate, a lead electroconductive layer-forming step of forming lead electroconductive layers having a higher electroconductivity than that of the lead underlayers each on the corresponding lead underlayers on the substrate on which the hole injection electrodes and the lead underlayers are formed by the first electrode-forming step an organic thin film layer-forming step of forming an organic thin film layer on the substrate on which the lead electroconductive layers are formed by the lead electroconductive layer-forming step, a second electrode-forming step of forming electron injection electrodes on the organic thin film layer formed by the organic thin film layer-forming step, and an IC-mounting step of mounting an electrode-driving IC on the substrate on which the lead electroconductive layers are formed by the lead electroconductive layer-forming step. The present method has a function to reduce the electric resistance of the lead wires connecting the hole injection electrodes and the electron injection electrodes to the electrode-driving IC. The electron injection electrodes each may be in a double layer structure an under layer for the electron injection electrode and an electroconductive layer for the electron injection electrode.

PREFERRED EMBODIMENTS OF THE INVENTION

Embodiments of the present invention will be described in detail below, referring to FIG. 1, FIG. 2, FIG. 3 and FIGS. 4A to 4E.

Embodiment 1

Figure 2:
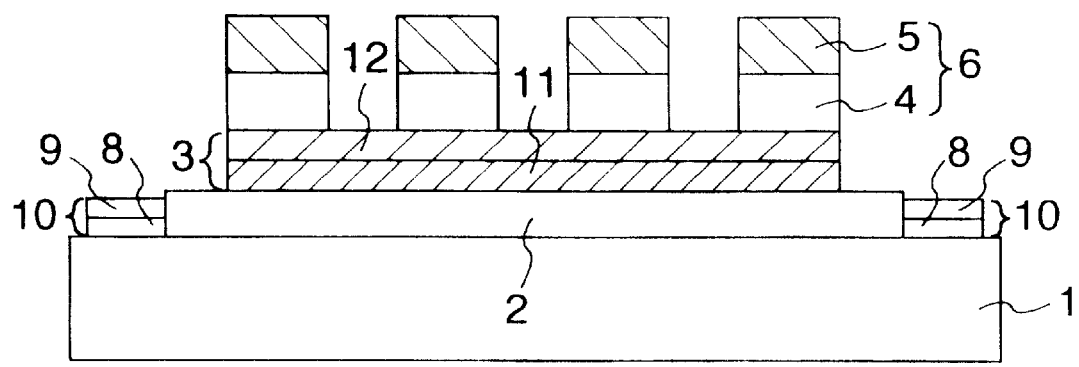
FIG. 2 is a schematic cross-sectional view of an organic thin film electroluminescent display device according to Embodiment 3 of the present invention.

FIG. 1 is a schematic plan view of an organic thin-film electroluminescent display device according the Embodiments 1, 2 and 3 of the present invention and FIG. 2 is a schematic cross-sectional view of an organic thin-film electroluminescent display device according to Embodiment 3 of the present invention.

As shown in FIGS. 1 and 2, numeral 1 is a substrate, 2 hole injection electrodes, 3 an organic thin film layer, 6 electron injection electrodes, 7 an electrode-driving IC, and 10 lead wires.

In FIG. 1, organic thin film layer 3 is formed on substrate 1 on which hole injection electrodes 2 are formed, and electron injection electrodes 6 are formed on organic thin film layer 3. Lead wires 10 are provided on substrate 1 so as to connected hole injection electrodes 2 and electron injection electrodes 6 to electrode-driving IC 7. In Embodiment 1, lead wires 10 each are in a double layer structure of lead underlayer 8 and lead electroconductive layer 9 formed on lead underlayer 8, but electron injection electrodes 6 each are in a single layer structure of underlayer 4 for the electron injection electrode.

In the herein described embodiments of the present invention, quartz, non-alkali glass, alkali grass, polyethylene terephthalate, polycarbonate, etc. can be used for the substrate, but the substrate materials are not particularly limited thereto, so long as they can be formed into transparent support sheets.

Tin-containing indium oxide (ITO: indium tin oxide), antimony-containing tin oxide (ARO: antimony tin oxide), aluminum-containing zirconium oxide (AZO: aluminum zirconium oxide), etc. can be used for hole injection electrodes 2, but the electrode materials are not particularly limited thereto, so long as they can serve as transparent electrode materials.

Organic thin film layer 3 may be either in a single layer structure of luminescent layer 12 or in a multilayer structure of function separation type. The multilayer structure may be in any of double layer, triple layer and multilayer structures such as a double layer structure of hole transport layer 11 and luminescent layer 12 formed on hole transport layer 11, a double layer structure of luminescent layer 12 and electron transport layer (not shown in the drawing) formed on luminescent layer 12, a triple layer structure of hole transport layer 11, luminescent layer 12 formed on hole transport layer 11 and electron transport layer (not shown in the drawing) formed on luminescent layer 12, etc.

For luminescent layer 12, organic compounds of good film formability with fluorescent emission in the visible range are desirable. Alqz, etc. can be used for this purpose, but the present invention is not particularly limited thereto.

For hole transport layer 11, transparent organic compounds of good carrier mobility and film formability are desirable. TPD, etc. can be used for this purpose, but the present invention is not particularly limited thereto.

Lead underlayers 8 are made of the same material as that of hole injection electrode 2. For lead electroconductive layers 9, any materials can be used, so long as they have a good electroconductivity. For example, copper, silver, gold, platinum, aluminum, iron, nickel or molybdenum can be used for this purpose.

Electron injection electrodes 6 are made of Al-Li alloy, Mg-Mg alloy, etc., and materials having a low work function, but a high electroconductivity are desirable to facilitate injection of electrons into luminescent layer 12.

Formation of hole injection electrodes 2, organic thin film layer 3 and electron injection electrodes 6 on substrate 1 can be carried out according to well known thin film-forming procedures such as vapor deposition procedure, spin coating procedure, casting procedure, LB procedure, etc.

Embodiment 1 of the present invention will be described in detail below:

An ITO thin film was formed on substrate 1 of alkali glass to a thickness of 0.16 μm by sputtering and then a resist film was formed on the ITO thin film to a thickness of 10 μm by spin coating a resist material (OFPR-800: trademark of a product made by Tokyo Ohka K>K>, Japan), followed by masking, light exposure and development, whereby the resist film on the IRO thin film was subjected to patternining to a desired shaped Then, substrate 1 was dipped into 50% hydrochloric acid at 60° C. to etch the ITC thin film off from the regions having no resist film thereon, and then the resist film was removed, whereby substrate 1 having hole injection electrodes 2 and lead underlayers 8 thereon, both being made from the IRO thin film, was obtained. Then, a resist material (OFPR-800) was applied to substrate 1 by spin coating to form a resist film having a thickness of 10 μm. The resist film on substrate 1 was subjected to patterning of desired shape by masking, light exposure and development to make the resist film remain only in regions on which an organic thin film layer 3 is to be formed. Substrate 1 having the resist film thus formed thereon was subjected to successive ultrasonic cleaning with a cleaning agent (Semicoclean: trademark of a product made by Furuuchi Kagaku K.K., Japan) for 5 minutes and then with pure water for 10 minutes, and then dipped in a copper plating solution (Newrea: trademark of a product made by Okuno Seiyaku Kogyo K.K., Japan), while passing electricity through lead underlayers 8 at a current density of 10 A/cm$^2$ to form 2 μm-thick lead electroconductive layers 9 made of copper on lead underlayers 8 by plating. After removal of the resist film from substrate 1 having lead electroconductive layers 9 formed thereon, substrate 1 was subjected to successive ultrasonic cleaning with a cleaning agent (Semiconclean) for 5 minutes, then with pure water for 10 minutes, then with an aqueous solution of aqua ammonia/aqueous 35% hydrogen peroxide solution/water (1/1/5 by volume) for 5 minutes, and then with pure water at 70° C. for 5 minutes, and then subjected to removal of moisture from the surface of substrate 1 by nitrogen blowing and to drying by heating at 250° C. Then, hole transport layer 11 consisting of a 0.05 μm-thick TPD thin film was formed on the regions having hole injection electrodes 2 formed on thus cleaned substrate 1 by vapor deposition and further a luminescent layer 12 made from a 0.075 μm-thick Alqz thin film was formed on the surface of the hole transport layer 11 by vapor deposition. Then, a desired mask was laid on the surface of luminescent layer 11, and a plurality of electron injection electrodes 6 made from 0.25 μm-thick Mg-Ag alloy thin film were formed thereon by two-source vapor deposition. In embodiment 1 of the present invention luminescent layer 12 had a size of 50 mm×100 mm and hole injection electrodes 2 and electron injection electrodes 6 each took a plurality of segment forms with a width of 1 mm at a spacing of 1 mm. With this structure, hole injection electrodes 2 consisted of 25 segments and electron injection electrodes 6 consisted of 50 segments to enable a matrix display of 25×50 segments. Then, electrode-driving IC 7 was mounted on substrate 1 having electron injection electrodes 6 by COG (chip on glass) mounting procedure, whereby an organic thin-film electroluminescent display device having hole injection electrodes 2 as common electrodes and electron injection electrodes 6 as segment electrodes was fabricated.

In Embodiment 1 of the present invention, hole injection electrodes 2 and electron injection electrodes 6 were provided in a form of straight lines crossing at right angles to one another, but the form is not particularly limited thereto in the present invention.

Embodiment 2

An organic thin-film electroluminescent display device according to Embodiment 2 of the present invention has substantially the same structure as that of Embodiment 1, except that electron injection electrodes 6 each to be formed on organic thin film layer 3 has a double layer structure of underlayer 4 for the electron injection electrode and electroconductive layer 5 for the electron injection electrode, and lead wires 10 each are in a single layer structure of lead underlayer 8. Underlayer 4 for the electron injection electrode is made of Al-Li alloy, Mg-Ag alloy, etc. To facilitate injection of electrons into luminescent layer 12, underlayer materials having a low work function and a high electroconductity are preferable. For electroconductive layer 5 for the electron injection electrode, any materials can be used, so far as they have a high electroconductivity. For example, copper, silver, gold, platinum, aluminum, iron, nickel or molybdenum can be used for this purpose.

Embodiment 2 of the present invention will be described in detail below:

An ITO thin film was formed on substrate 1 of alkali glass to a thickness of 0.16 μm by sputtering and then a resist film was formed on the ITO thin film to a thickness of 10 μm by spin coating a resist material (OFPR-800) followed by masking, light exposure and development, whereby the resist film on the ITO thin film was subjected to patterning to a desired shape. Then, substrate 1 was dipped in 50% hydrochloric acid at 60° C. to etch the ITO thin film off only from the regions having no resist film thereon, and then the resist film was removed, whereby substrate 1 having hole injection electrodes 2 and lead wires 10, both being made from the ITO thin film, was obtained. After removal of resist film from substrate 1, substrate 1 was subjected to successive ultrasonic cleaning with a cleaning agent (semicondean) for 5 minutes, then with pure water for 10 minutes, a solution of aqua ammonia/aqueous 35% hydrogen peroxide solution/water (1:1:5 by volume) for 5 minutes, and then with pure water at 70° C. for 5 minutes, and then subjected to removal of moisture from the surface of substrate 1 by nitrogen blowing and to drying by heating at 250° C. Then, organic thin film layer 3 in a double layer structure consisting of a 0.05 μm-thick TPD thin film and a 0.075 μm-thick Alqz thin film was formed on the regions having hole injection electrodes 2 on thus cleaned substrate 1 by vapor deposition, and then a desired mask was laid on the surface of the Alqz thin film. Then, underlayer 4 consisting of a 0.25 μm-thick Al-Li alloy thin film for the electron injection electrode was formed thereon by two-source vapor deposition. Furthermore, an electroconductive layer 5 made from a 0.8 μm-thick Ag thin film for the electron injection electrode was formed on the under layer 4 for the electron injection electrode by vapor deposition, whereby electron injection electrodes 6 in a double layer structure were formed on organic thin film layer 3. Luminescent layer 12 had a size of 50 mm×100 mm, and hole injection electrodes 2 and electron injection electrodes 6 each took a plurality of segment forms with a width of 1 mm at a spacing of 1 mm. With this structure, hole injection electrodes 2 consisted of 25 segments and electron injection electrodes 6 consisted of 50 segments to enable a matrix display of 25×50 segments. Then, electrode-driving IC 7 was mounted on substrate 1 having electron injection electrodes 6 by COG mounting procedure, whereby an organic thin-film electroluminescent display device having hole injection electrodes 2 as common electrodes and electron injection electrodes 6 as segment electrodes was fabricated.

In Embodiment 2 of the present invention, hole injection electrodes 2 and electron injection electrodes 6 were provided in a form of straight lines crossing at right angles to one another, but the form is not particularly limited thereto in the present invention.

Embodiment 3

Embodiment 3 of the present invention is based on a combination of the foregoing Embodiments 1 and 2. That is, Embodiment 3 includes lead wires 10 in a double layer structure, each consisting of lead underlayer 8 and a lead electroconductive layer 9 formed on the lead underlayer 8, and electron injection electrodes 6 in a double layer structure, each consisting of an under layer 4 for the electron injection electrode and an electroconductive layer 5 for the electron injection electrode.

Embodiment 3 of the present invention will be described in detail below:

An ITO thin film was formed on substrate 1 of alkali glass to a thickness of 0.16 μm by sputtering and then a resist film was formed on the ITO thin film to a thickness of 10 μm by spin coating a resist material (OFPR-800), followed by masking, light exposure and development, whereby the resist film on the ITO thin film was subjected to patterning to a desired shape. Then, substrate 1 was dipped in 50% hydrochloric acid at 60° C. to etch the ITO thin film off only from the regions having no resist film thereon, and then the resist film was removed, whereby substrate 1 having hole injection electrodes 2 and lead under layers 8, both being made from the ITO thin film, was obtained. Then, a resist material (OFPR-800) was applied only to regions on which an organic thin layer is to be formed on substrate 1 by spin coating to form a resist film having a thickness of 10 μm, followed by masking, light exposure and development, whereby the resist film was subjected to patterning to a desired shape. Then, substrate 1 having the resist film thereon was subjected to successive ultrasonic cleaning with a cleaning agent (Semicoclean) for 5 minutes and then with pure water for 10 minutes, and then dipped in a copper plating solution (Nuwrea), while passing electricity through lead underlayers 8 at a current density of 10 A/cm² to form 2 μm-thick lead electroconductive layers 9 made of copper on lead underlayers 8 by plating. After removal of the resist film from sustrate 1 having lead electroconductive layers 9 formed thereon, substrate 1 was subjected to successive ultrasonic cleaning with a cleaning agent (Semicoclean) for 5 minutes, then with pure water for 10 minutes, then with an aqueous solution of aqua ammonia/aqueous 35% hydrogen peroxide solution/water (⅟₁₅ by volume) for 5 minutes, and then with pure water at 70° C. for 5 minutes, and then subjected to removal of moisture from the surface of substrate 1 by nitrogen blowing and to drying by heating at 250° C. Then, hole transport layer 11 consisting of a 0.05 μm-thick TPD thin film was formed on the regions having hole injection electrodes 2 formed on thus cleaned substrate 1 by vapor deposition and further a luminescent layer 12 made from a 0.075 μm-thick Alqz thin film was formed on the surface of the hole transport layer 11 by vapor deposition. Then, a desired mask was laid on the surface of luminescent layer 11. Then, underlayer 4 made from a 0.25 μm-thick Mg-Ag alloy thin film for the electron injection electrode was formed thereon by two-source vapor deposition. Furthermore, an electroconductive layer 5 consisting of a 0.8 μm-thick Ag thin film for the electron injection electrode was formed on the underlayer 4 for the electron injection electrode by vapor deposition, whereby electron injection electrodes 6 in a double layer structure were formed. Luminescent layer 12 had a size of 50 mm×100 mm, and hole injection electrodes 2 and electron injection electrodes 6 each took a plurality of segment forms with a width of 1 mm at a spraing of 1 mm. With this structure, hole injection electrodes 2 consisted of 25 segments and electron injection electrodes 6 consisted of 50 segments to enable a matrix display of 25×50 segments. Then, electrode-driving IC 7 was mounted on substrate 1 having electron injection electrodes 6 by COG mounting procedure, whereby an organic thin-film electroluminescent display device having hole injection electrodes 2 as common electrodes and electron injection electrodes 6 as segment electrodes was fabricated.

In Embodiment 3 of the present invention, hole injection electrodes 2 and electron injection electrodes 6 were provided in a form of straight lines crossing at right angles to one another, but the form is not particularly limited thereto in the present invention.

Comparative Example 1

An organic thin-film electroluminescent display device having no lead electroconductive layers 9 was fabricated in the same manner as in Embodiment 1 except that lead underlayers 8 were not subjected to copper plating. That is, lead wires 10 and electron injection electrodes 6 were each in a single layer structure.

Evaluation

The organic thin-film electroluminescent display devices fabricated in Embodiment 1 and Comparative Example 1 were driven each at a dc voltage of 6 V, whereby light was emitted at a current of 20 md /cm² with an average light emission of 500 cd/m². Differences in luminescence brightness in the luminescent, regions of the organic thin-film electroluminescent display device fabricated according to Embodiment 1 of the present invention were ±3%, whereas those of Comparative Example 1 were ±10%.

When the organic thin-film electroluminescent display devices of Embodiment 2 and Comparative Example 1 were driven each at a dc voltage of 6 V, while using the electron injection electrodes as common electrodes, differences in luminescence brightness in the luminescent regions of the organic thin-film electroluminescent display device according to Embodiment 2 of the present invention were ±2% at any voltage, whereas those of Comparative Example 1 were ±10%.

When the organic thin-film electroluminescent display devices of Embodiment 3 and Comparative Example 1 were driven at a dc voltage of 6 V, while using the electron injection electrodes as common electrodes, differences in luminescence brightness in the luminescent regions of the organic thin-film electroluminescent display device according to Embodiment 3 of the present invention were ±1% at any voltage, whereas those of Comparative Example 1 were ±10%.

Embodiment 4

Figure 3:
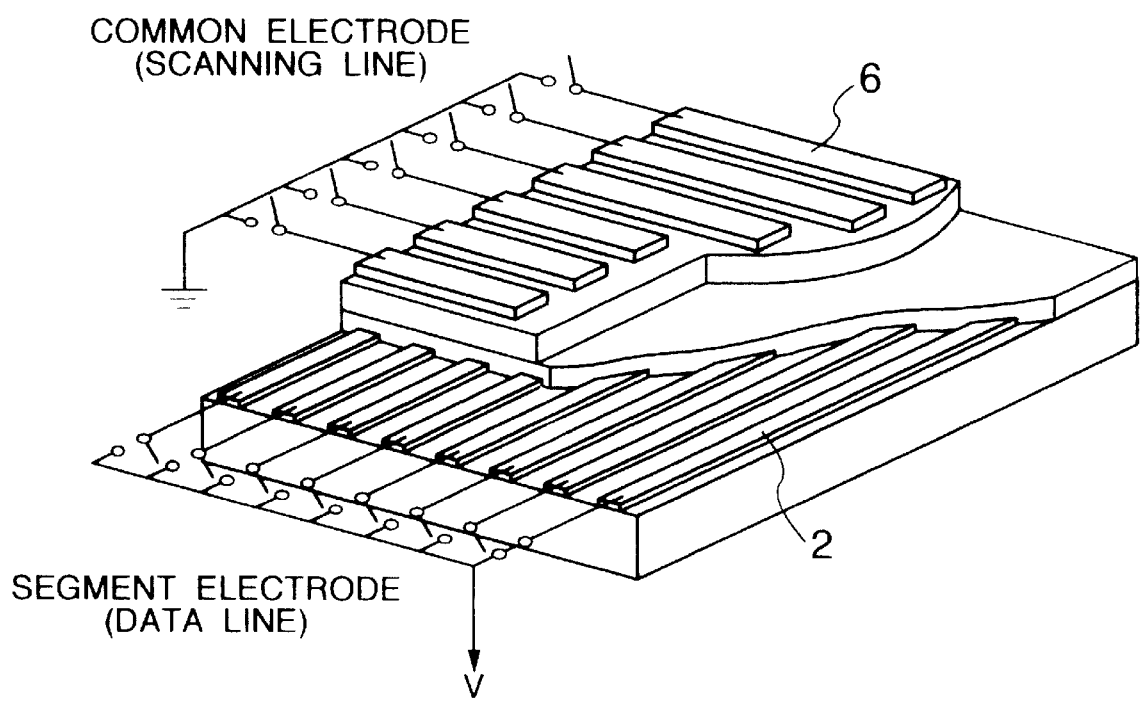
FIG. 3 is a schematic view showing a method for driving an organic thin-film electroluminescent display device according to Embodiment 4 of the present invention.

A method for driving an organic thin-film electroluminescent display device according to Embodiment 4 of the present invention will be described below:

FIG. 3 is a schematic view showing a method for driving an organic thin-film electroluminescent display device according to Embodiment 4 of the present invention. An organic thin-film electroluminescent display device used in Embodiment 4 was that of Embodiment 2, where electron injection electrodes 6 were in a double layer structure each consisting of an underlayer 4 for the electron injection electrode and an electroconductive layer 5 for the electron injection electrode. Electron injection electrodes 6 as common electrodes were subjected to line sequential pulse application, and at the same time hole injection electrodes 2 as segment electrodes were subjected to voltage application according to signals for image display by electrode driving IC, whereby light was emitted in desired regions of the organic thin-film electroluminescent display device.

Comparative Example 2

An organic thin-film electroluminescent display device used in Comparative Example 2 was the same as used in Embodiment 4, but driving was carried out with hole injection electrodes 2 as common electrodes and electron injection electrodes 6 as segment electrodes.

Evaluation

The organic thin-film electroluminescent display device was driven according to the methods of Embodiment 4 and Comparative example 2 each at a dc voltage of 6 V, whereby light was emitted at a current of 20 mA/cm² with an average light emission of 500 cd/m². Differences in luminescence brightness in the luminescent regions of the organic thin film electroluminescent display device according to the method of Embodiment 4 were ±2%, whereas those according to the method of Comparative Example 2 were ±5%.

Fluctuations in luminescence brightness of an organic thin-film electroluminescent display device could be prevented by driving electron injection electrodes 6 having a low electric resistance as common electrodes and hole injection electrodes 2 as segment electrodes according to the method of Embodiment 4.

Embodiment 5

Figure 4A:
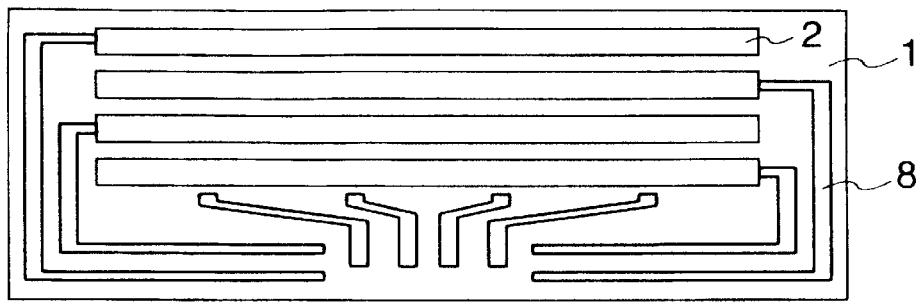
FIG. 4A is a schematic plan view of a substrate on which hole injection electrodes and lead underlayers are formed by a first, electrode-forming step according to Embodiment 5 of the present invention.
Figure 4B:
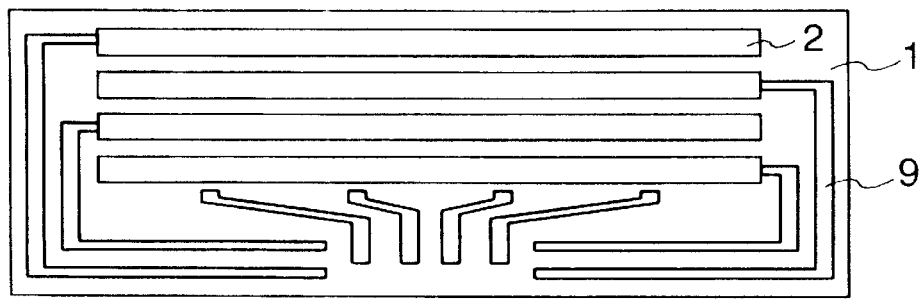
FIG. 4B is a schematic plan view of a substrate on which lead electroconductive layers are formed by a lead electroconductive layer-forming step according to Embodiment 5 of the present invention.
Figure 4C:
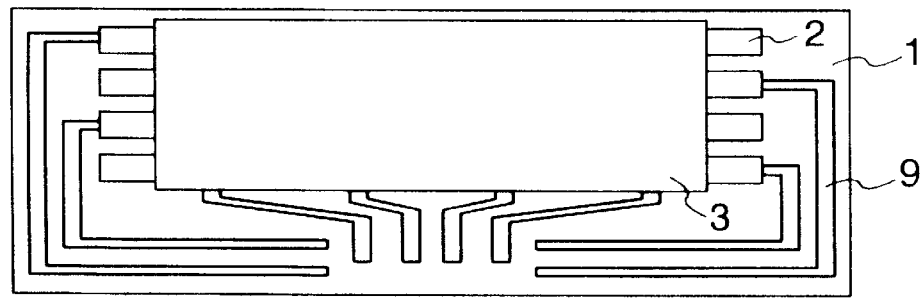
FIG. 4C is a schematic plan view of a substrate on which an organic thin film layer is formed by an organic thin film layer-forming step according to Embodiment 5 of the present invention.
Figure 4D:
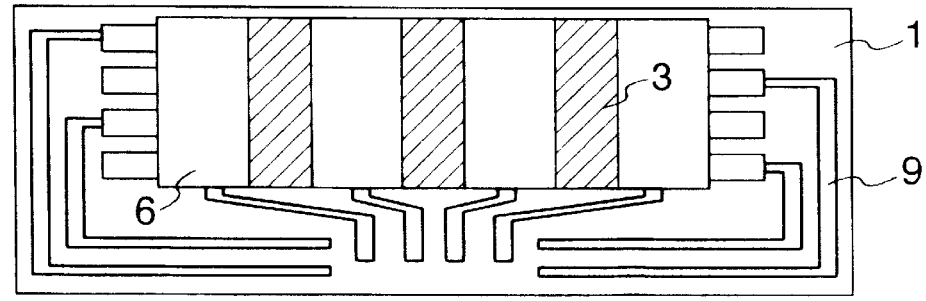
FIG. 4D is a schematic plan view of a substrate on which electron injection electrodes are formed by a second, electrode-forming step according to Embodiment 5 of the present invention
Figure 4E:
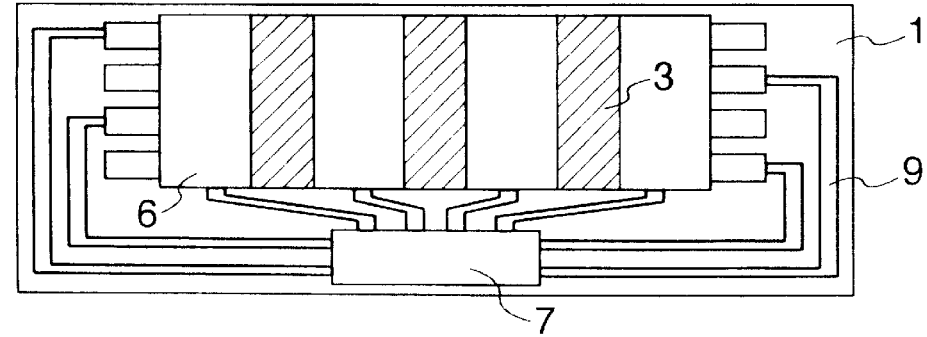
FIG. 4E is a schematic plan view of a substrate on which an electrode-driving IC is mounted by an IC-mounting step according to Embodiment 5 of the present invention.
Figure 5:
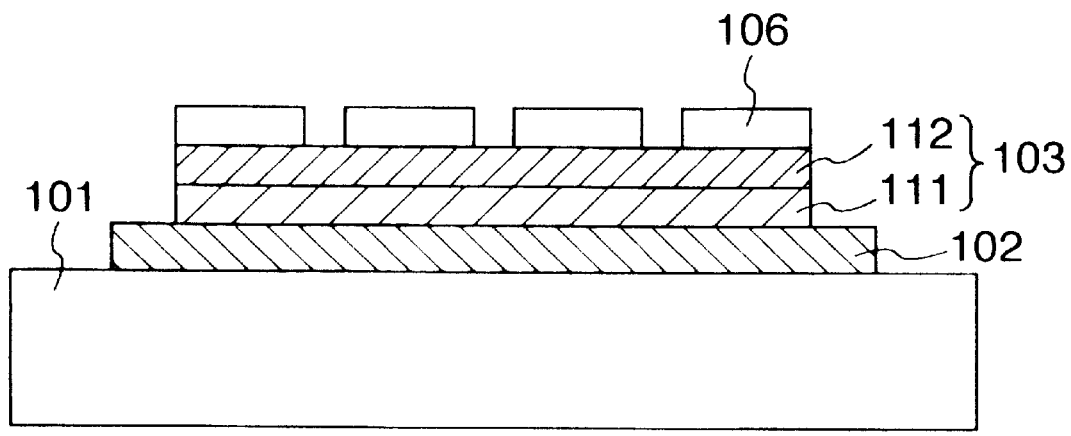
FIG. 5 is a schematic cross-sectional view of one conventional organic thin-film electroluminescent display device.
Figure 6:
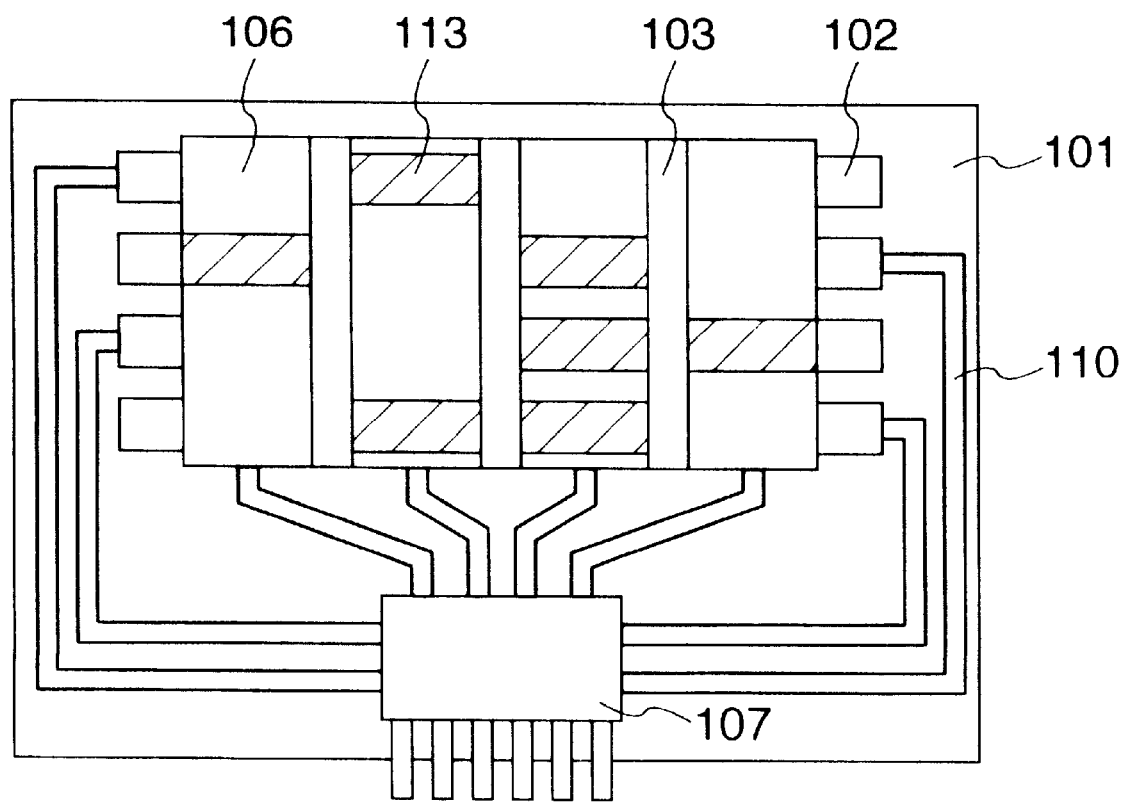
FIG. 6 is a schematic plan view of a conventional organic thin-film electroluminescent display device.

FIG. 4A is a schematic plan view of substrate 1 on which hole injection electrodes 2 and lead underlayers 8 are formed by a first electrode-forming step according to Embodiment 5 of the present invention; FIG. 4B is a schematic plan view of substrate 1 on which lead electroconductive layers 9 are formed by lead electroconductive layer 9-forming step according to Embodiment 5 of the present invention; FIG. 4C is a schematic plan view of substrate 1 on which organic thin layer film 3 is formed by organic thin film layer 3-forming step according to Embodiment 5 of the present invention; FIG. 4D is a schematic plan view of substrate 1 on which electron injection electrodes 6 are formed by a second electrode-forming step according to Embodiment 5 of the present invention; and FIG. 4E is a schematic plan view of substrate 1 on which electrode-driving IC 7 is mounted by IC-mounting step according to Embodiment 5 of the present invention, where numeral 8 is lead underlayers and 9 lead electroconductive layers. Substrate 1, hole injection electrodes 2, organic thin film layer 3, electron injection electrodes 6, electrode-driving IC 7, and lead wires 10 are the same as described in Embodiment 1 of the present invention, and thus their explanation will be omitted hereunder only by identifying them as the same reference numerals.

A method for fabricating an organic thin-film electroluminescent display device according to Embodiment 5 of the present invention will be described in detail below:

A transparent electroconductive film (not shown in the drawing) is formed on substrate 1, and then subjected to patterning by photolithography, etc. to form hole injection electrodes 2 and lead underlayers 8, as shown in FIG. 4A. Then, lead electroconductive layers 9 having a higher electroconductivity than that of lead underlayers 8 are formed on the corresponding lead underlayers 8, as shown in FIG. 4B. For lead electroconductive layers 9, gold, silver, copper or their alloys is desirable, and lead electroconductive layers 8 can be formed by applying a metal paste to lead underlayers 8, followed by firing, by pressure welding a metal foil with heating, by vapor deposition, by plating or the like. Organic thin film layer 3 is formed on substrate 1 having lead electroconductive layers 9 formed thereon by vapor deposition, etc. as shown in FIG. 4C, and then electron injection electrodes 6 patterned as shown in FIG. 4D are formed on organic thin film layer 3. Furthermore, electrode-driving IC 7 is mounted on substrate 1 having electron injection electrodes 6 formed thereon by COG (chip on glass) mounting procedure or COF (chip on film) mounting procedure, whereby an organic thin-film electroluminescent display device is fabricated.

Detailed explanation of the method for fabrication will be omitted because the fabrication can be made in the same manner as for Embodiment 1 of the present invention.

As described in detail above, the present invention can provide an effective organic thin-film electroluminescent display device capable of making the luminescent layer larger in size and narrower in pitch, thereby improving resolution, because fluctuations in luminescence prightness due to different ohmic losses of lead wires of an organic thin-film electroluminescent display device and also due to different quantities of current from one electron injection electrode to another can be prevented in the present invention.

Furthermore, the present invention can provide an effective method for driving an organic thin-film electroluminescent display device having a large display surface with a higher resolution without any fluctuation in luminescence brightness, because the electron injection electrodes having a low electric resistance are driven as common electrodes to prevent fluctuations in luminescence brightness.

Still furthermore, the present invention can provide an effective method for fabricating an organic thin-film electroluminescent display device having a larger luminent layer, provided with luminent regions at a narrower pitch, an improved resolution and a higher productivity, because the electric resistance of lead wires for connecting the hole injection electrodes and the electron injection electrodes to the electrode-driving IC can be lowered in a simple manner.

What is claimed is:

1. An organic thin-film electroluminescent display device, which comprises a substrate, hole injection electrodes formed on the substrate, an organic thin film layer formed on the hole injection electrodes, electron injection electrodes formed on the organic thin film layer, an electrode-driving IC mounted on the substrate for driving the hole injection electrodes and the electron injection electrodes and lead wires provided on the substrate for connecting the hole injection electrodes and the electron injection electrodes to the electrode-driving IC, the lead wires each comprising a lead underlayer made of the same material as that of the hole injection electrode and a lead elecroconductive layer formed on the lead underlayer and having a higher electroconductivity than that of the lead underlayer.

2. An organic thin-film electroluminescent display device according to claim 1, wherein the lead electroconductive layer is made of at least one of copper, silver, gold, platinum, aluminum, iron, nickel and molybdenum or an alloy containing at least one thereof.

3. An organic thin-film electroluminescent display device, which comprises a substrate, hole injection electrodes formed on the substrate, an organic thin film layer formed on the hole injection electrodes, electron injection electrode, formed or the organic thin film layer, an electrode-driving IC mounted on the substrate for driving the hole injection electrodes and the electron injection electrodes and lead wires provided on the substrate for connecting the hole injection electrodes and the electron injection electrodes to the electrode-driving IC, the electron injection electrodes each comprising an underlayer for the electron injection electrode and an electroconductive layer for the electron injection electrode formed on the underlayer for the electron injection electrode and having a higher electroconductivity than that of the underlayer for the electron injection electrode.

4. An organic thin-film electroluminescent display device according to claim 3, wherein the electroconductive layer for the electron injection electrode is made of a least one of copper, silver, gold, platinum, iron, nickel and molybdenum or an alloy containing at least one thereof.

5. An organic thin-film electroluminescent display device, which comprises a substrate, hole injection electrodes formed on the substrate, an organic thin film layer formed on the hole injection electrodes, electron injection electrodes formed on the organic thin film layer, an electrode-driving IC mounted on the substrate for driving the hole injection electrodes and the electron injection electrodes and lead wires provided on the substrate for connecting the hole injection electrodes and the electron injection electrodes to the electrode-driving IC, the lead wires each comprising a lead under layer made of the same material as that of the hole injection electrode and a lead electroconductive layer formed on the lead underlayer and having a higher electroconductivity than that of the lead underlayer, and the electron injection electrodes each comprising an underlayer for the electron injection electrode and an electroconductive layer for the electron injection electrode formed on the underlayer for the electron injection electrode and having a higher electroconductivity than that of the underlayer for the electron injection electrode.

6. An organic thin-film electroluminescent display device according to claim 5, wherein the lead electroconductive layer and the electroconductive layer for the electron injection electrode each are made of at least one of copper, silver, gold, platinum, aluminum, iron, nickel and molybdenum or an alloy containing at least one thereof.

* * * * *